(12) United States Patent
Nakano et al.

(10) Patent No.: US 9,333,593 B2
(45) Date of Patent: May 10, 2016

(54) JOINING METHOD, JOINT STRUCTURE AND METHOD FOR PRODUCING THE SAME (71) Applicant: MURATA MANUFACTURING CO., LTD., Nagaokakyo-shi, Kyoto-Fu (JP)

(72) Inventors: Kosuke Nakano, Nagaokakyo (JP); Hidekiyo Takaoka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/469,842

(22) Filed: Aug. 27, 2014

(65) Prior Publication Data
US 2014/0363221 A1 Dec. 11, 2014

Related U.S. Application Data (63) Continuation of application No. PCT/JP2013/053028, filed on Feb. 8, 2013.

(30) Foreign Application Priority Data

Mar. 5, 2012 (JP) ................................. 2012-048021

(51) Int. Cl.
*B23K 1/19* (2006.01)
*B23K 1/00* (2006.01)
(Continued)

(52) U.S. Cl.
CPC . *B23K 31/02* (2013.01); *B23K 1/00* (2013.01); *B23K 1/0016* (2013.01); *B23K 1/20* (2013.01); *B23K 35/025* (2013.01); *B23K 35/22* (2013.01); *B23K 35/26* (2013.01); *B23K 35/262* (2013.01); *B23K 35/30* (2013.01); *B23K 35/3026* (2013.01); *C22C 9/00* (2013.01); *C22C 9/01* (2013.01); *C22C 9/05* (2013.01); *C22C 9/06* (2013.01); *C22C 13/00* (2013.01);
(Continued)

(58) Field of Classification Search
CPC H01L 2924/014; H01L 24/06; H05K 3/3463; H05K 3/243; H05K 3/341; H05K 3/3457; B23K 35/262; B23K 35/0244; B23K 35/40
See application file for complete search history.

(56) References Cited

U.S. PATENT DOCUMENTS

2004/0007384 A1 1/2004 Soga et al.
2005/0218525 A1 10/2005 Takahashi et al.
(Continued)

FOREIGN PATENT DOCUMENTS

CN 1444273 A 9/2003
CN 1819189 A 8/2006
(Continued)

OTHER PUBLICATIONS

PCT/JP2013/053028 Written Opinion dated Mar. 29, 2013.

*Primary Examiner* — Erin Saad
(74) *Attorney, Agent, or Firm* — Arent Fox LLP (57) ABSTRACT A first joining object and a second joining object are joined to each other using an insert material. The first joining object and/or the second joining object has a first metal composed of Sn or an alloy containing Sn. The insert material contains, as a main component, a second metal which is an alloy containing at least one selected from among Ni, Mn, Al and Cr, and Cu, and is located between the first joining object and the second joining object. When subjected to heat treatment to produce an intermetallic compound of the first metal and the second metal, the first joining object and the second joining object are joined to each other.

9 Claims, 5 Drawing Sheets (51) Int. Cl.
  *B23K 31/02* (2006.01)
  *B23K 35/26* (2006.01)
  *B23K 35/30* (2006.01)
  *B23K 35/22* (2006.01)
  *C22C 9/00* (2006.01)
  *C22C 9/01* (2006.01)
  *C22C 9/05* (2006.01)
  *C22C 9/06* (2006.01)
  *C22C 13/00* (2006.01)
  *C22C 13/02* (2006.01)
  *H05K 3/34* (2006.01)
  *B23K 35/02* (2006.01)
  *H01G 4/228* (2006.01)
  *B23K 1/20* (2006.01)

(52) U.S. Cl.
  CPC ............... *C22C 13/02* (2013.01); *H01G 4/228* (2013.01); *H05K 3/3442* (2013.01); *H05K 3/3463* (2013.01); *B23K 2201/00* (2013.01); *B23K 2201/42* (2013.01); *B23K 2203/08* (2013.01); *H05K 2201/1028* (2013.01); *H05K 2201/10636* (2013.01); *Y02P 70/611* (2015.11); *Y02P 70/613* (2015.11); *Y10T 403/479* (2015.01)

(56) References Cited

U.S. PATENT DOCUMENTS

| 2006/0186550 | A1  | 8/2006  | Ikeda et al. |
| 2007/0074790 | A1* | 4/2007  | Yamakoshi et al. .......... 148/426 |
| 2007/0205017 | A1* | 9/2007  | Takakusaki et al. .......... 174/260 |
| 2011/0291282 | A1  | 12/2011 | Yamada et al. |
| 2012/0156512 | A1  | 6/2012  | Nakano et al. |

FOREIGN PATENT DOCUMENTS

| CN | 1825578      A  | 8/2006  |
| JP | 2002-254194   A | 9/2002  |
| JP | 2003-332731   A | 11/2003 |
| JP | 2004-330247   A | 11/2004 |
| JP | 2005-288458   A | 10/2005 |
| JP | 2007-260695   A | 10/2007 |
| JP | 2008-200728   A | 9/2008  |
| JP | 2008-238233   A | 10/2008 |
| JP | 2008-302396   A | 12/2008 |
| JP | 2010-179336   A | 8/2010  |
| TW | 201124224     A | 7/2011  |
| WO | WO-2011-027659 A1 | 3/2011 |

\* cited by examiner

US 9,333,593 B2

JOINING METHOD, JOINT STRUCTURE AND METHOD FOR PRODUCING THE SAME

CROSS REFERENCE TO RELATED APPLICATIONS

The present application is a continuation of International application No. PCT/JP2013/053028, filed Feb. 8, 2013, which claims priority to Japanese Patent Application No. 2012-048021, filed Mar. 5, 2012, the entire contents of each of which are incorporated herein by reference.

FIELD OF THE INVENTION

The present invention relates to a joining method of joining one joining object (first joining object) and the other joining object (second joining object) to each other and a joint structure formed by using the joining method, and more particularly to a joining method used, for example, when an external electrode of a chip type electronic part being the first joining object is joined to an electrode for mounting on a substrate, being the second joining object, a joint structure formed by using the joining method, and a method for producing the joint structure.

BACKGROUND OF THE INVENTION

As a mounting method in mounting a surface-mounted electronic part on a substrate or the like, a method of mounting an electronic part by soldering an external electrode of the electronic part to an electrode for mounting (land electrode) on the substrate is widely used.

As a solder paste used for such mounting by soldering, for example, a solder paste including a mixture of (a) a second metal (or an alloy) ball made of a high melting point metal such as Cu, Al, Au, or Ag or a high melting point alloy containing the high melting point metal, and (b) a first metal ball made of Sn or In is proposed (Patent Document 1).

Further, in Patent Document 1, a joining method using the solder paste, and a method for manufacturing an electronic equipment are disclosed.

Figure 6A:
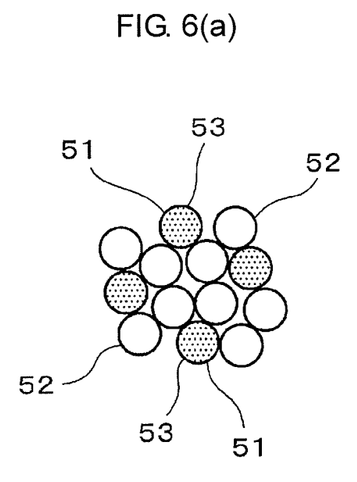
FIG. 6(a) is a drawing showing a state before heating and FIG. 6(b) is a drawing showing a state after completion of a soldering step.
Figure 6B:
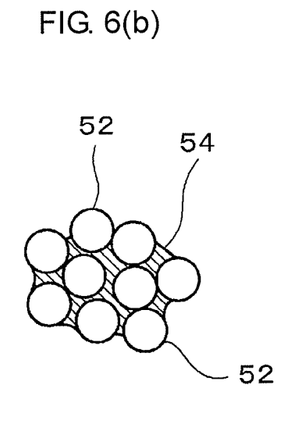

By the way, when soldering is performed by using the solder paste described in Patent Document 1, as schematically shown in FIG. 6(a), the solder paste including low melting point metal (e.g., Sn) balls 51, high melting point metal (e.g., Cu) balls 52 and a flux 53 is heated to react, and after soldering, as shown in FIG. 6(b), a plurality of high melting point metal balls 52 are connected to one another with an intermetallic compound 54 formed between a low melting point metal originating from the low melting point metal ball and a high melting point metal originating from the high melting point metal ball interposed therebetween, and by this connecting body, joining objects are connected (soldered) to each other.

In the case of the solder paste described in Patent Document 1, the intermetallic compound between the high melting point metal (e.g., Cu) and the low melting point metal (e.g., Sn) is produced by heating the solder paste in THE soldering step, and in the combination of Cu (high melting point metal) and Sn (low melting point metal), a large amount of Sn being a low melting point metal remains because the diffusion rates of these metals are slow. In the case of a solder paste in which Sn remains, the joint strength under elevated temperatures is significantly deteriorated, and there may be cases where a product cannot be used depending on the type of the product to be joined. Further, there is a possibility that Sn remaining after the step of soldering may be melted and flowed out in the subsequent another soldering step, and there is a problem that this soldering is low in reliability as high temperature solder which is used for a bonding method with temperature hierarchy.

That is, for example, in a manufacturing process of a semiconductor device, when a semiconductor device is manufactured after undergoing a step of soldering, and then the semiconductor device is to be mounted on a substrate by a reflow soldering method, there is a possibility that Sn remaining after the step of soldering in the manufacturing process of a semiconductor device is melted and flowed out in the step of reflow soldering.

Further, it is necessary to heat the solder paste at a high temperature for a long time in the soldering step in order to convert the low melting point metal entirely to the intermetallic compound so that Sn may not remain, but this heating is practically impossible in consideration of the balance with productivity.

In order to solve the above-mentioned problems, there is proposed a solder paste including a metal component containing a first metal powder and a second metal powder having a higher melting point than the first metal powder, and a flux component, wherein the first metal is Sn or an alloy containing Sn, and the second metal (Cu—Mn or Cu—Ni) is a metal or an alloy which forms, with the first metal, an intermetallic compound exhibiting a melting point of 310° C. or higher, and has a lattice constant difference of 50% or more, the lattice constant difference being a difference between the lattice constant of the intermetallic compound produced first around the second metal powder and the lattice constant of the second metal component (Patent Document 2).

In addition, Patent Document 2 mentions Cu—Mn or Cu—Ni as the second metal.

Further, Patent Document 2 proposes a joining method and a joint structure that use the above-mentioned solder paste, and a method for manufacturing an electronic equipment.

It is described that in accordance with the joining method using the solder paste, joining by which the amount of remaining Sn is largely reduced to avoid the flow out of solder at the time of reflowing, and which is excellent in the joint strength and joint reliability at a high temperature can be performed.

However, in the case of the joining method using the solder paste of Patent Document 2, since a diffusion reaction of the second metal such as Cu—Mn or Cu—Ni with the first metal such as Sn or a Sn alloy rapidly occurs, the time during which Sn exhibits a liquid state is short and an intermetallic compound having a high melting temperature is formed soon, and therefore there is a possibility that air gaps are generated within the joint portion. Accordingly, a joining method in which joining having higher joint reliability can be performed is expected.

Patent Document 1: Japanese Patent Laid-open Publication No. 2002-254194
Patent Document 2: WO 2011/027659 A

SUMMARY OF THE INVENTION

The present invention was made to solve the above-mentioned problem, and it is an object of the present invention to provide a joining method capable of obtaining a highly reliable joint portion which does not have air gaps, is compact and has excellent heat resistance, a joint structure formed by using the joining method and having high joint reliability, and a method for producing the joint structure.

In order to solve the above-mentioned problem, a joining method of the present invention is
a method of joining a first joining object and a second joining object to each other by using an insert material, wherein
the first joining object and/or the second joining object has a first metal composed of Sn or an alloy containing Sn, which has a lower melting point than an alloy composing the following insert material,
the insert material contains, as a main component, a second metal which is an alloy containing at least one selected from among Ni, Mn, Al and Cr, and Cu, and
the first joining object and the second joining object are subjected to heat treatment with the insert material located therebetween to produce an intermetallic compound of the first metal which the first joining object and/or the second joining object has, and the second metal composing the insert material, and thereby the first joining object and the second joining object are joined to each other.

In addition, as the first and second joining objects, for example, an external electrode of a chip type electronic part and an electrode for mounting on a substrate on which the chip type electronic part is mounted can be mentioned, and the present invention includes the case where one joining object is, for example, a "Cu wire plated with Sn or a Sn alloy."

Further, in the present invention, examples of the first metal composed of Sn or an alloy containing Sn include metals given as a plating layer formed on the surface of an electrode and composed of Sn or an alloy containing Sn. In this case, the plating layer composed of the first metal (Sn or an alloy containing Sn) is preferably located at the outermost surface of the first joining object and/or the second joining object, however, it is also possible to further form another layer (e.g., a noble metal layer) on the outermost surface.

Further, the insert material contains the above-mentioned alloy (second metal) as a main component, and an antioxidant film such as a Sn-plating layer or an Au-plating layer may be formed on the surface thereof.

In the present invention, the first metal (alloy containing Sn) is preferably an alloy containing Sn in an amount of 70% by weight or more.

When the first metal is an alloy containing Sn in an amount of 70% by weight or more, it is possible to achieve more reliably the effect of the present invention of enabling to obtain a highly reliable joint portion which has no air gaps and is excellent in heat resistance.

Further, the first metal (alloy containing Sn) is preferably an alloy containing Sn in an amount of 85% by weight or more.

When the first metal is an alloy containing Sn in an amount of 85% by weight or more, it is possible to obtain a joint portion having higher heat resistance more reliably.

In the present invention, the second metal composing the insert material is preferably predominantly composed of a Cu—Ni alloy or a Cu—Mn alloy.

When the second metal composing the insert material is predominantly composed of a Cu—Ni alloy and/or a Cu—Mn alloy, it is possible to obtain a joint portion having particularly high heat resistance.

Further, it is preferred that the Cu—Ni alloy contains Ni in an amount of 5 to 30% by weight and the Cu—Mn alloy contains Mn in an amount of 5 to 30% by weight.

By employing the above-mentioned constitution, a joint portion having particularly high heat resistance can be obtained more reliably.

A joint structure of the present invention is characterized in that it is formed by the above-mentioned joining method of the present invention.

A method for producing a joint structure of the present invention is characterized in that the above-mentioned joining method of the present invention is used in the method.

The joining method of the present invention can attain a highly reliable joint portion which has no air gaps and has high heat resistance since, in joining a first joining object and a second joining object to each other by using an insert material, the first joining object and/or the second joining object has a first metal (low melting point metal) composed of Sn or an alloy containing Sn, an insert material contains, as a main component, an alloy (second metal) containing at least one selected from among Ni, Mn, Al and Cr, and Cu, and the first joining object and the second joining object are subjected to heat treatment with the insert material positioned therebetween to produce an intermetallic compound of the first metal (low melting point metal) which the first joining object and/or the second joining object has, and the second metal (the Cu alloy) composing the insert material, and thereby the first joining object and the second joining object are joined to each other.

That is, since the first joining object and/or the second joining object has a first metal (Sn or an Sn alloy), and the insert material contains, as a main component, a second metal which is an alloy containing at least one selected from among Ni, Mn, Al and Cr, and Cu, rapid diffusion of the second metal (the Cu alloy) and the first metal (low melting point metal) occurs in the step of heat treatment, an intermetallic compound having a high melting point is produced in the joint portion, and most of the first metal turns into an intermetallic compound. As a result, it is possible to obtain a joint portion having high joint reliability at a high temperature, which does not cause falling off of an electronic part when reflow is carried out multiple times after an electronic part is mounted or when the mounted electronic part (for example, car-mounted electronic part) is used in a high-temperature environment, for example, in the case where the first joining object is an external electrode of the electronic part and the second joining object is an electrode for mounting of a substrate.

In addition, when the first joining object and the second joining object are joined to each other by using the insert material, the heat treatment is performed in a state in which the insert material is positioned between the first joining object and the second joining object. In this case, when the temperature reaches the melting point of the first metal (low melting point metal such as Sn or a Sn alloy) or higher, the first metal in the first joining object and/or the second joining object is melted. Then, the first metal and the second metal (Cu alloy) in the insert material are rapidly diffused to produce an intermetallic compound.

When the heating is further continued thereafter, the first metal being a low melting point metal further reacts with the second metal, and when the compositional ratio of the first metal to the second metal is in a preferred condition, all of the first metal turns into an intermetallic compound and the first metal disappears in the joint portion.

Further, in the present invention, since a lattice constant difference between the second metal and an intermetallic compound produced at an interface between the first metal and the second metal is large (the lattice constant difference between the second metal and the intermetallic compound is 50% or more), the reaction between the first metal and the second metal is repeated while the intermetallic compound is peeled and dispersed in the melted first metal (Sn or a Sn alloy), and therefore production of the intermetallic compound outstandingly proceeds and the content of the first metal (Sn or a Sn alloy) can be adequately reduced in a short time.

As a result, it is possible to perform joining having high strength in high temperature.

In addition, since all Al and Cr constituting the second metal (Cu alloy) have smaller first ionization energy than Cu and these metals (Al and Cr) are solid-solved in Cu, Al and Cr are oxidized prior to Cu. As a result, diffusion of Cu which is not oxidized into the melted first metal (Sn or a Sn alloy) is promoted, and the second metal forms an intermetallic compound with the first metal in an extremely short time. Accordingly, the content of the first metal in the joint portion is decreased by the amount of the intermetallic compound formed, and thereby, the melting point of the joint portion is raised to improve the strength in high temperature.

Further, in the present invention, since the insert material containing the second metal (Cu alloy) can be supplied in a state of having a small surface area like in a plate shape, the rate of the reaction of the second metal with the first metal (Sn or a Sn alloy) contained in the first joining object and/or the second joining object can be reduced.

That is, when the insert material is plate-shaped, it becomes possible to adequately reduce the surface area of the second metal compared with the case of supplying the second metal composing the insert material, for example, in the form of a paste as the form of a powder having a large surface area, and therefore the rate of the reaction of the second metal with the first metal can be reduced. As a result, it becomes possible to lengthen the duration of time during which the first metal (Sn or a Sn alloy) exists in a liquid state to form a joint portion which has no air gaps and is compact.

Further, since the duration of time during which the first metal is liquid is lengthened, a self-alignment property is improved by the surface tension of the first metal in a liquid state.

Further, in accordance with the joint structure of the present invention, it is possible to provide a joint structure in which, as described above, the first joining object and the second joining object are reliably joined to each other with a joint portion predominantly composed of an intermetallic compound having a high melting point interposed therebetween, and which has high strength in high temperature.

In addition, in order to achieve the effect of the present invention more reliably, it is preferred that the proportion between the amount of the first metal (Sn or a Sn alloy) which the first joining object and the second joining object have, and the amount of the second metal (an alloy containing at least one selected from among Ni, Mn, Al and Cr, and Cu) contained in the insert material is in a predetermined range, and it is generally preferred that the proportion of the amount of the first metal to the total amount of the first metal and the second metal is 70% by volume or less.

BRIEF EXPLANATION OF THE DRAWINGS

FIGS. 6(a) and 6(b) are drawings showing a behavior of solder in the case of soldering using a conventional solder paste, wherein

DETAILED DESCRIPTION OF THE INVENTION

Embodiments of the present invention will be shown below, and characteristics of the present invention will be described in more detail.

In the present embodiment, a case in which an external electrode (first joining object) of a chip type electronic part (laminated ceramic capacitor) having the external electrodes disposed at both ends of a ceramic laminate is joined to an electrode for mounting (second joining object) on a glass-epoxy substrate with an insert material interposed therebetween will be described as an example.

[Preparation of First Joining Object and Second Joining Object]

Figure 1:
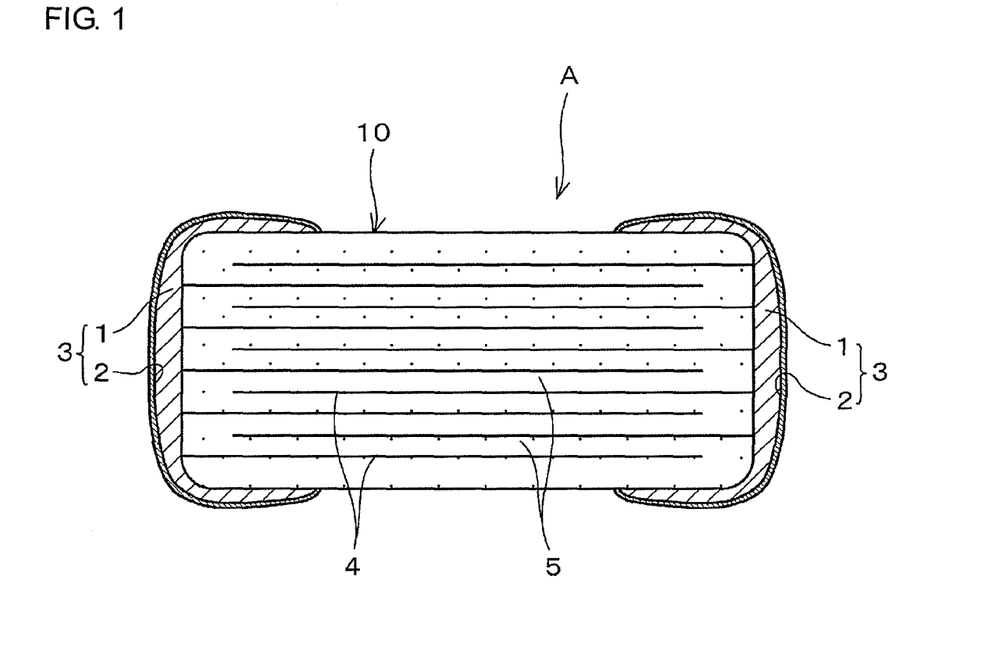
FIG. 1 is a drawing showing a chip type electronic part which is used to carry out the joining method of the present invention and is a first (or second) joining object.

First, as a first joining object, prepared was a chip type electronic part A provided with external electrodes 3 each obtained by forming a plating layer 2 of Sn or an alloy containing Sn (first metal having a lower melting point than the Cu alloy composing the insert material) as shown in sample Nos. 1 to 25 in Tables 1 and 2 on the surface of external electrode main bodies 1 which are formed at both ends of a ceramic laminate 10 formed by laminating internal electrodes 4 and ceramic layers 5 alternately and made of a Cu thick-film electrode, as shown in FIG. 1.

In addition, although not shown, Ni-plating was formed between the Cu thick-film electrode and the plating layer 2 of Sn or an alloy containing Sn.

The plating layer 2 does not necessarily have to cover the entire surface of the external electrode main body 1, and the plating layer 2 may be provided for the external electrode main body 1 in such a manner that an intermetallic compound is formed by the reaction with the following insert material C in a heat treatment step.

Figure 2:
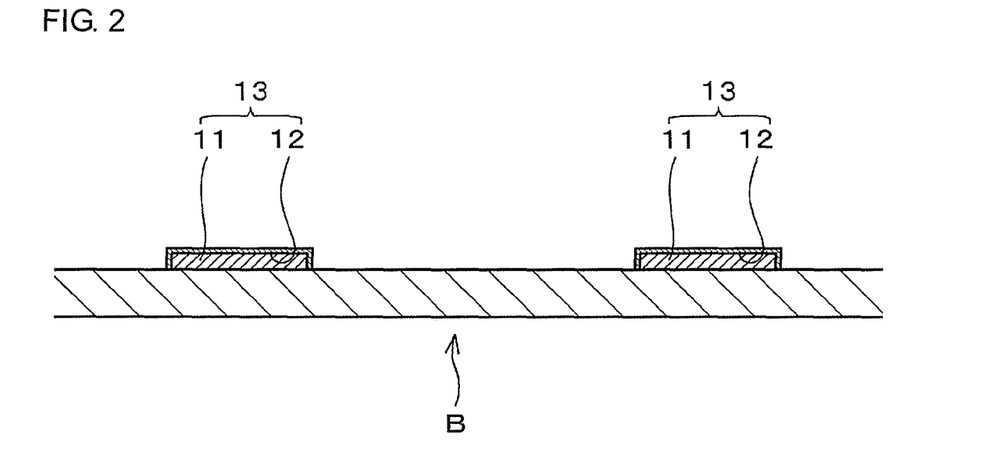
FIG. 2 is a drawing showing a glass-epoxy substrate which is used to carry out the joining method of the present invention and provided with an electrode for mounting being a second (or first) joining object.

Further, as shown in FIG. 2, as a second joining object, prepared was a glass-epoxy substrate B provided with electrodes for mounting 13 obtained by forming a plating layer 12 of the first metal (Sn or an alloy containing Sn) as shown in sample Nos. 1 to 25 in Tables 1 and 2 on the surface of a Cu electrode film 11 formed on the principal surface of the substrate. In addition, the plating layer 12 may be formed so as to cover the entire surface of the Cu electrode film 11, that is, the top face and the side face of the Cu electrode film 11, as shown in FIG. 2, or may be formed only on the top face of the Cu electrode film 11 or only on a part of the top face.

In the present embodiment, as the first metal (low melting point metal) for the plating layers 2 and 12 of the first joining object (external electrode of the chip type electronic part) and the second joining object (electrode for mounting of the glass-epoxy substrate), as shown in Tables 1 and 2, Sn-3Ag-0.5Cu, Sn, Sn-3.5Ag, Sn-0.75Cu, Sn-15Bi, Sn-0.7Cu-0.05Ni, Sn-5Sb, Sn-2Ag-0.5Cu-2Bi, Sn-30Bi, Sn-3.5Ag-0.5Bi-8In, Sn-9Zn, or Sn-8Zn-3Bi was used.

In addition, in the above expressions of the first metal, for example, the "Sn-3Ag-0.5Cu" of the sample No. 1 indicates that the low melting point metal material is an alloy (Sn alloy) containing Ag in an amount of 3% by weight, Cu in an amount of 0.5% by weight, and Sn as the rest of the material.

[Preparation of Insert Material]

Moreover, a plate-like insert material composed of a Cu alloy (second metal) as shown in Tables 1 and 2 was prepared as the insert material.

In addition, as the second metal composing the insert material, as shown in Tables 1 and 2, a Cu-5Ni, Cu-10Ni, Cu-15Ni, Cu-20Ni, Cu-30Ni, Cu-5Mn, Cu-10Mn, Cu-15Mn, Cu-20Mn, Cu-30Mn, Cu-12Mn-4Ni, Cu-10Mn-1P, Cu-10Al or Cu-10Cr alloy was used.

As the second metal composing the insert material, any one of Cu—Ni, Cu—Mn, Cu—Al and Cu—Cr alloys is usually used, and the insert material may contain Mn and Ni simultaneously like the sample No. 22, or may contain a third component such as P (phosphorus) like the sample No. 23.

Further, for comparison, the insert materials of sample Nos. 26 and 27 in Table 2, not complying with the requirements of the present invention, were prepared as the insert material.

In addition, the insert material of the sample No. 26 is an insert material composed of Cu, and the insert material of the sample No. 27 is an insert material composed of a Cu—Zn alloy.

[Joining of First Joining Object to Second Joining Object]

Figure 3:
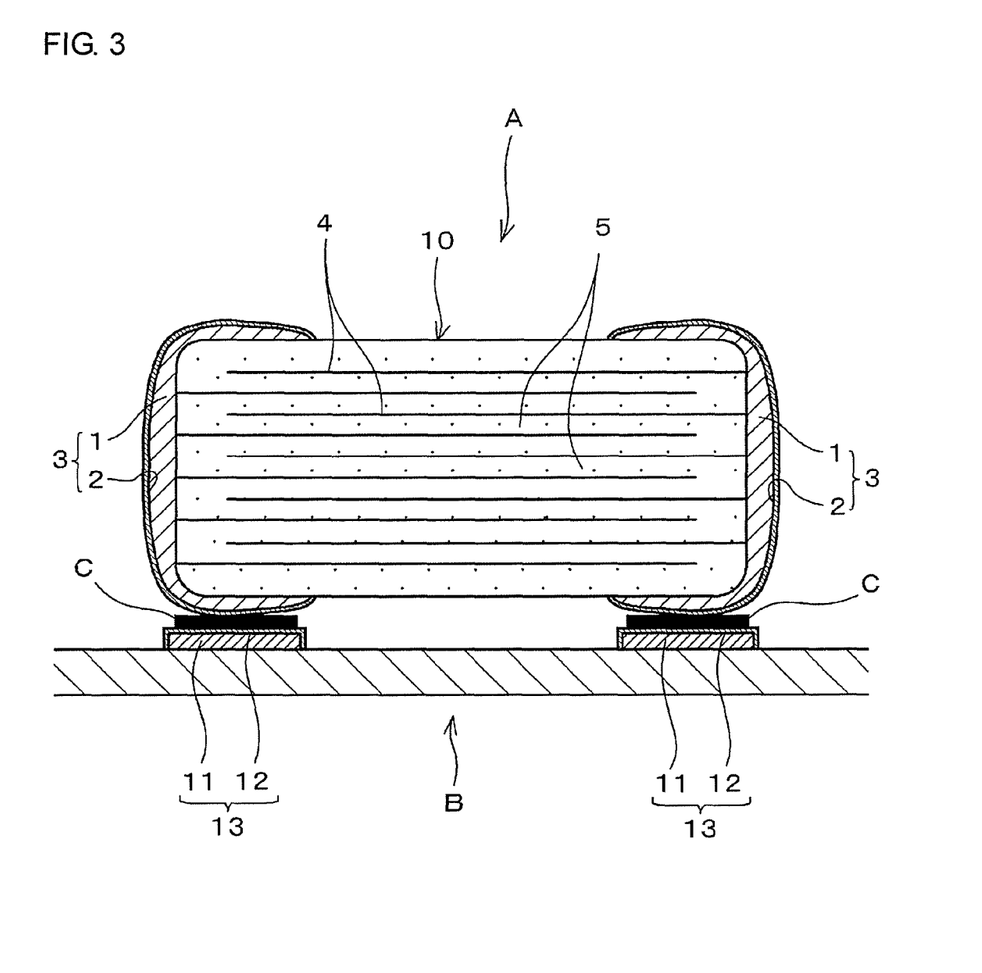
FIG. 3 is a drawing showing one step in joining the first joining object and the second joining object to each other by a joining method of the present invention.

As shown in FIG. 3, chip type electronic parts A in Tables 1 and 2 were each placed in such a manner that the external electrodes (first joining objects) 3 are opposed to electrodes for mounting (second joining objects) 13 on each of the glass-epoxy substrates B in Tables 1 and 2 with each of the insert materials in Tables 1 and 2 interposed therebetween, and the chip type electronic parts A were reflowed at 250° C. for 30 minutes.

Figure 4:
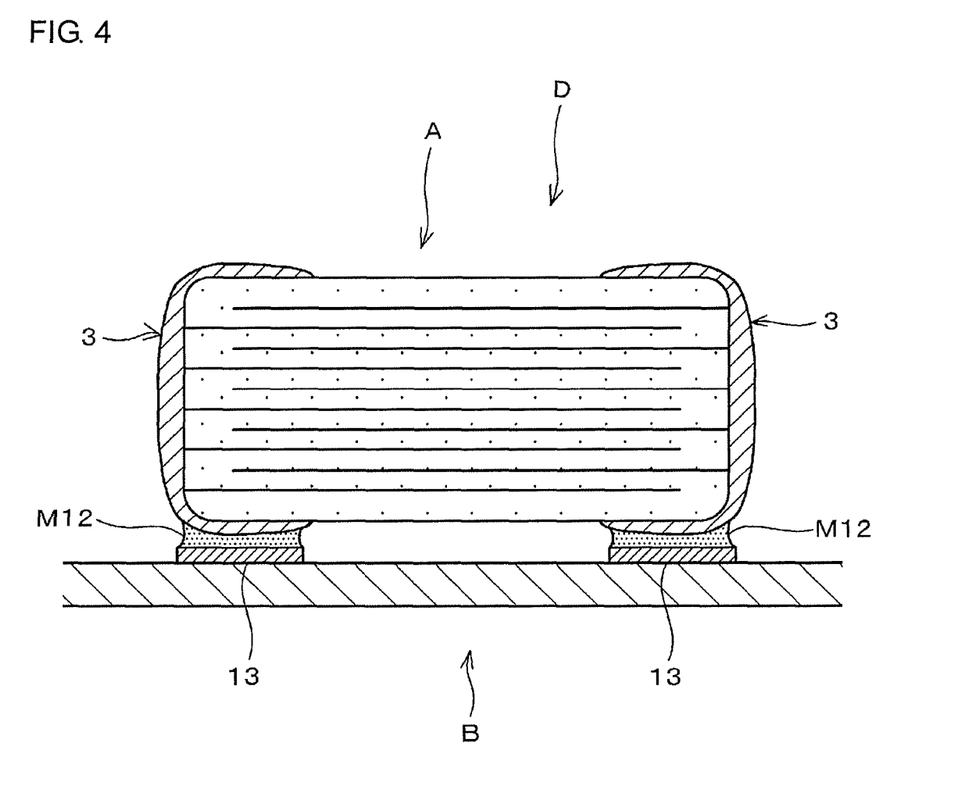
FIG. 4 is a drawing showing a joint structure formed by joining the first joining object and the second joining object to each other by the joining method of the present invention.

Thereby, as shown in FIG. 4, a joint structure D, in which the external electrode (first joining object) 3 of the chip type electronic part A and the electrode for mounting (second joining object) 13 of the glass-epoxy substrate B were joined to each other with an intermetallic compound (joint portion) M12 interposed therebetween, was obtained.

Figure 5:
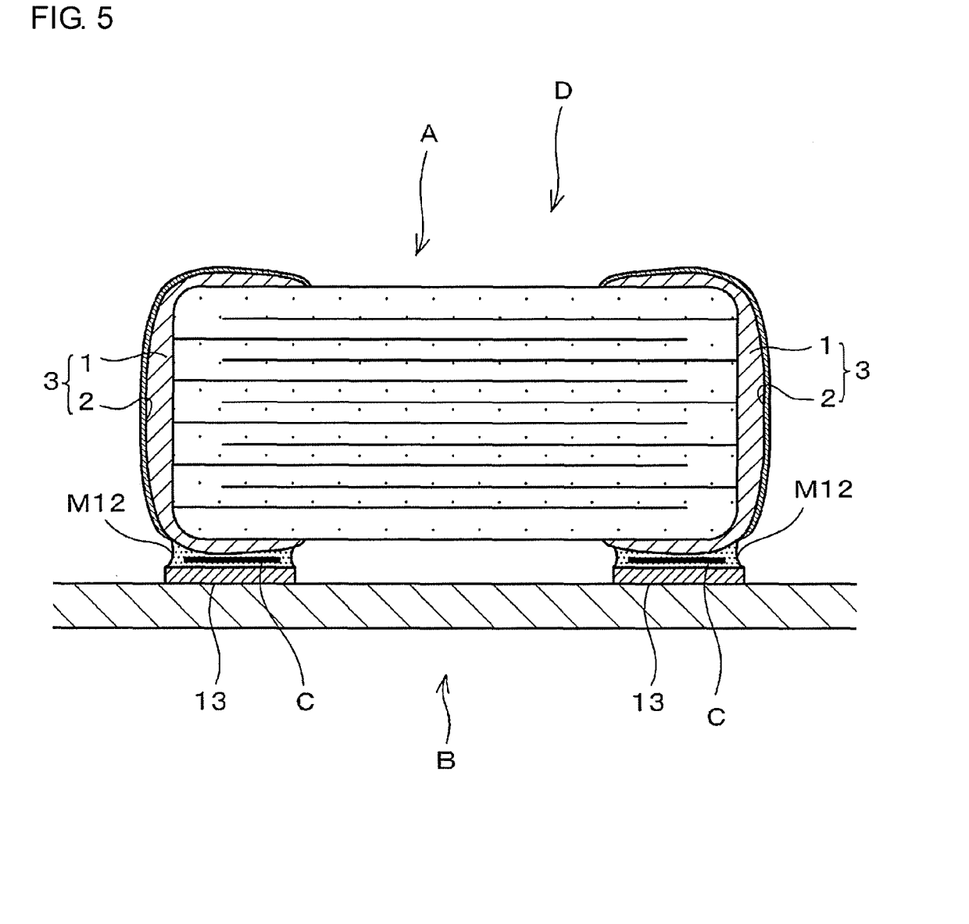
FIG. 5 is a drawing showing a variation example of the joint structure formed by joining the first joining object and the second joining object to each other by the joining method of the present invention.

In addition, FIG. 5 shows a variation example of the joint structure D thus obtained. In the joint structure of the present invention, as shown in FIG. 5, a part of the insert material C may remain, and of the plating layer 2 constituting the external electrode 3 and composed of Sn or an alloy (low melting point metal) containing Sn, the plating layer 2 in a portion which is not in contact with the insert material C may remain unreacted.

Further, similarly, using insert materials (an insert material of the sample No. 26 composed of Cu, and an insert material of the sample No. 27 composed of a Cu—Zn alloy) not complying with the requirements of the present invention, the same external electrodes of the chip type electronic parts as those used in the sample Nos. 1 to 10 were joined to electrodes for mounting of the glass-epoxy substrates.

[Evaluation of Characteristics]

The joint structures thus obtained were used as samples, and their characteristics were evaluated by the following methods.

<<Joint Strength>>

The shear strength of each of the obtained joint structures was measured by using a bonding tester, and the joint strength was evaluated.

Measurement of the shear strength was carried out under conditions of a lateral push rate: 0.1 mm·s$^{-1}$ and room temperature and 260° C.

The sample having a shear strength of 20 Nmm$^{-2}$ or more was rated as "⊙" (excellent), the sample having a shear strength of 2 Nmm$^{-2}$ or more and less than 20 Nmm$^{-2}$ was rated as "○" (good), and the sample having a shear strength less than 2 Nmm$^{-2}$ was rated as "x" (defective).

The measured joint strength values at room temperature and at 260° C. of the samples and the evaluation results are shown together in Tables 1 and 2.

<<Evaluation of Remaining Component>>

About 7 mg of an intermetallic compound (reaction product), solidified after the reflow, in the joint portion was cut out, and subjected to differential scanning calorimetry (DSC) using $Al_2O_3$ as a reference under conditions of a measurement temperature of 30° C. to 300° C. and a temperature rise rate of 5° C./min in a nitrogen atmosphere. The amount of the remaining low melting point metal component was quantified from an endothermic quantity of a melting endothermic peak at a melting temperature of the first metal (low melting point metal) component in the resulting DSC chart and the content (% by volume) of the remaining low melting point metal was determined. Then, the case where the content of the remaining low melting point metal was 0% by volume was rated as "⊙" (excellent), the case where the content was more than 0% by volume and 50% by volume or less was rated as "○" (good), and the case where the content was more than 50% by volume was rated as "x" (defective).

The contents of the remaining low melting point metal and evaluation results are shown together in Tables 1 and 2.

<<Flow Out Percent Defective>>

The flow out percent defective of the obtained joint structure was determined by the following method.

First, the joint structure was sealed with an epoxy resin, left standing in an environment of 85% in relative humidity, and heated in the reflow condition of a peak temperature of 260° C. The joint structure in which the joining material was remelted and flowed out was regarded as a defective one, and the incidence rate of flow out defects was determined. The flow out percent defective was determined from this result.

The case where the flow out percent defective of the joining material was 0% was rated as "⊙" (excellent), the case where it was more than 0% and 50% or less was rated as "○" (good), and the case where it was more than 50% was rated as "x" (defective).

The flow out percent defectives and evaluation results are shown together in Tables 1 and 2.

<<Compactness>>

A cross-section of the obtained joint structure was observed with a metallograph and the presence or absence of air gaps present in a joint portion was checked. The case where no air gap more than 50 μm on a side was present was rated as "⊙" and the case where an air gap more than 50 μm on a side was present was rated as "x."

The results of compactness evaluation are shown together in Tables 1 and 2.

TABLE 1

| Sample No. | Composition of Plating layer (First Metal) of First and Second Joining Objects | Composition of Insert Material (Second Metal) | Joint Strength and Evaluation (Room Temperature) | | Joint Strength and Evaluation (260° C.) | | Content of Remaining Low Melting Point Metal and Evaluation | | Flow Out Percent Defective and Evaluation | | Compactness |
|---|---|---|---|---|---|---|---|---|---|---|---|
| | | | Joint Strength ($Nmm^{-2}$) | Evaluation | Joint Strength ($Nmm^{-2}$) | Evaluation | Content (%) | Evaluation | Percent Defective (%) | Evaluation | |
| 1 | Sn—3Ag—0.5Cu | Cu—5Ni | 27 | ⊙ | 26 | ⊙ | 0 | ⊙ | 0 | ⊙ | ⊙ |
| 2 | Sn—3Ag—0.5Cu | Cu—10Ni | 26 | ⊙ | 25 | ⊙ | 0 | ⊙ | 0 | ⊙ | ⊙ |
| 3 | Sn—3Ag—0.5Cu | Cu—15Ni | 27 | ⊙ | 26 | ⊙ | 0 | ⊙ | 0 | ⊙ | ⊙ |
| 4 | Sn—3Ag—0.5Cu | Cu—20Ni | 28 | ⊙ | 27 | ⊙ | 0 | ⊙ | 0 | ⊙ | ⊙ |
| 5 | Sn—3Ag—0.5Cu | Cu—30Ni | 28 | ⊙ | 19 | ○ | 15 | ○ | 12 | ○ | ⊙ |
| 6 | Sn—3Ag—0.5Cu | Cu—5Mn | 28 | ⊙ | 27 | ⊙ | 0 | ⊙ | 0 | ⊙ | ⊙ |
| 7 | Sn—3Ag—0.5Cu | Cu—10Mn | 27 | ⊙ | 24 | ⊙ | 0 | ⊙ | 0 | ⊙ | ⊙ |
| 8 | Sn—3Ag—0.5Cu | Cu—15Mn | 28 | ⊙ | 27 | ⊙ | 0 | ⊙ | 0 | ⊙ | ⊙ |
| 9 | Sn—3Ag—0.5Cu | Cu—20Mn | 29 | ⊙ | 28 | ⊙ | 0 | ⊙ | 0 | ⊙ | ⊙ |
| 10 | Sn—3Ag—0.5Cu | Cu—30Mn | 29 | ⊙ | 19 | ○ | 15 | ○ | 11 | ○ | ⊙ |
| 11 | Sn | Cu—10Mn | 25 | ⊙ | 23 | ⊙ | 0 | ⊙ | 0 | ⊙ | ⊙ |
| 12 | Sn—3.5Ag | Cu—10Mn | 26 | ⊙ | 25 | ⊙ | 0 | ⊙ | 0 | ⊙ | ⊙ |
| 13 | Sn—0.75Cu | Cu—10Mn | 28 | ⊙ | 22 | ⊙ | 0 | ⊙ | 0 | ⊙ | ⊙ |
| 14 | Sn—15Bi | Cu—10Mn | 30 | ⊙ | 26 | ⊙ | 0 | ⊙ | 0 | ⊙ | ⊙ |

TABLE 2

| Sample No. | Composition of Plating layer (First Metal) of First and Second Joining Objects | Composition of Insert Material (Second Metal) | Joint Strength and Evaluation (Room Temperature) | | Joint Strength and Evaluation (260° C.) | | Content of Remaining Low Melting Point Metal and Evaluation | | Flow Out Percent Defective and Evaluation | | Compactness |
|---|---|---|---|---|---|---|---|---|---|---|---|
| | | | Joint Strength ($Nmm^{-2}$) | Evaluation | Joint Strength ($Nmm^{-2}$) | Evaluation | Content (%) | Evaluation | Percent Defective (%) | Evaluation | |
| 15 | Sn—0.7Cu—0.05Ni | Cu—10Mn | 28 | ⊙ | 25 | ⊙ | 0 | ⊙ | 0 | ⊙ | ⊙ |
| 16 | Sn—5Sb | Cu—10Mn | 25 | ⊙ | 21 | ⊙ | 0 | ⊙ | 0 | ⊙ | ⊙ |
| 17 | Sn—2Ag—0.5Cu—2Bi | Cu—10Mn | 29 | ⊙ | 26 | ⊙ | 0 | ⊙ | 0 | ⊙ | ⊙ |
| 18 | Sn—30Bi | Cu—10Mn | 31 | ⊙ | 26 | ⊙ | 21 | ○ | 17 | ○ | ⊙ |
| 19 | Sn—3.5Ag—0.5Bi—8In | Cu—10Mn | 27 | ⊙ | 24 | ⊙ | 0 | ⊙ | 0 | ⊙ | ⊙ |
| 20 | Sn—9Zn | Cu—10Mn | 25 | ⊙ | 25 | ⊙ | 0 | ⊙ | 0 | ⊙ | ⊙ |
| 21 | Sn—8Zn—3Bi | Cu—10Mn | 27 | ⊙ | 23 | ⊙ | 0 | ⊙ | 0 | ⊙ | ⊙ |
| 22 | Sn—3Ag—0.5Cu | Cu—12Mn—4Ni | 28 | ⊙ | 22 | ⊙ | 0 | ⊙ | 0 | ⊙ | ⊙ |
| 23 | Sn—3Ag—0.5Cu | Cu—10Mn—1P | 29 | ⊙ | 24 | ⊙ | 0 | ⊙ | 0 | ⊙ | ⊙ |
| 24 | Sn—3Ag—0.5Cu | Cu—10Al | 26 | ⊙ | 22 | ⊙ | 26 | ○ | 15 | ○ | ⊙ |
| 25 | Sn—3Ag—0.5Cu | Cu—10Cr | 24 | ⊙ | 21 | ⊙ | 43 | ○ | 31 | ○ | ⊙ |
| *26 | Sn—3Ag—0.5Cu | Cu | 25 | ⊙ | 0.2 | X | 75 | X | 89 | X | ⊙ |
| *27 | Sn—3Ag—0.5Cu | Cu—10Zn | 24 | ⊙ | 1.5 | X | 72 | X | 81 | X | ⊙ |

A sample with the sample No. marked with * is a sample not satisfying the requirements of the present invention. (comparative example)

As shown in Tables 1 and 2, it was verified with respect to the joint strength at room temperature that both of the samples (examples) of sample Nos. 1 to 25 complying with the requirements of the present invention and the samples of comparative examples of sample Nos. 26 and 27 not complying with the requirements of the present invention exhibit a joint strength of 20 $\text{Nmm}^{-2}$ or more and have practical strength.

On the other hand, with respect to the joint strength at 260° C., it was verified that while the samples of comparative examples of sample Nos. 26 and 27 exhibited an insufficient joint strength of 2 $\text{Nmm}^{-2}$ or less, the samples of examples of the present invention of sample Nos. 1 to 25 held a joint strength of 20 $\text{Nmm}^{-2}$ or more and have practical strength.

Further, it was verified with respect to the content of the remaining low melting point metal (evaluation of a remaining component) that while the samples of comparative examples of sample Nos. 26 and 27 have contents of the remaining low melting point metal of more than 50% by volume, all of the samples of examples of the present invention of sample Nos. 1 to 25 have contents of the remaining low melting point metal of 50% by volume or less.

Further, it was verified that the samples of sample Nos. 1 to 23 using the Cu—Ni alloy, the Cu—Mn alloy, the Cu—Mn—Ni alloy or the Cu—Mn—P alloy as the second metal composing the insert material have lower contents of the remaining low melting point metal than the samples of sample Nos. 24 and 25 using the Cu—Al alloy or the Cu—Cr alloy as the second metal.

Further, it was verified that the samples of sample Nos. 1 to 4 and 6 to 9 using the Cu—Ni alloy or the Cu—Mn alloy in which the amount of Ni or Mn is 5 to 20% by weight have lower contents of the remaining low melting point metal than the samples of sample Nos. 5 and 10 in which the amount of Ni or Mn is 30% by weight.

Moreover, it was verified that when Sn or an alloy containing Sn in an amount of 85% by weight or more was used as the first metal (low melting point metal) (sample Nos. 1 to 4, 6 to 9, 11 to 17 and 19 to 23), the samples are particularly preferred since the contents of the remaining low melting point metal thereof were 0% by volume.

Further, with respect to the flow out percent defective of the joining material, while the samples of comparative examples of sample Nos. 26 and 27 had a flow out percent defective of 50% or more, all of the samples of examples of the present invention of sample Nos. 1 to 25 had a flow out percent defective of 50% or less.

It was verified that particularly when Sn or an alloy containing Sn in an amount of 85% by weight or more was used as the first metal (low melting point metal) and an alloy in which the amount of Ni or Mn is 5 to 20% by weight was used as the second metal (sample Nos. 1 to 4, 6 to 9, 11 to 17 and 19 to 23), these samples had high heat resistance so that the flow out percent defective was 0%.

Further, as described above, it was verified that all of the samples of sample Nos. 1 to 25 complying with the requirements of the present invention have practical heat resistance irrespective of the type of the first metal (low melting point metal), but it was found that in the samples of sample Nos. 5 and 10 in which the amount of Ni or Mn in the second metal is 30% by weight, the joint strength at 260° C. tends to be slightly lower compared with other samples (sample Nos. 1 to 4, 6 to 9, and 11 to 25).

In addition, it was verified that in accordance with the joining method of the present invention, a highly compact joint portion is obtained compared with the case where a first joining object and a second joining object, respectively containing no first metal such as Sn, are joined to each other by using a solder paste containing a first metal powder such as Sn, a second metal powder (Cu—Mn alloy or Cu—Ni alloy) having a higher melting point than the first metal powder, and a flux component, as described in the above-mentioned joining method of Patent Document 2.

In addition, in the embodiment described above, the case in which the first joining object is an external electrode of a chip type electronic part (laminated ceramic capacitor), and the second joining object is an electrode for mounting of a glass-epoxy substrate has been described as an example, but types of the first joining object and the second joining object are not limited to these cases.

For example, the first joining object and/or the second joining object may be an external electrode of an electronic part having another constitution, or an electrode formed on another substrate.

The present invention can also be applied to the case in which a "Cu wire plated with Sn or a Sn alloy" is joined to an electrode on a substrate or an external electrode of an electronic part.

The present invention is not intended to be limited to the above-mentioned embodiments in other points, and various applications and variations may be made on the composition of the first metal and the second metal or the like within the scope of the invention.

DESCRIPTION OF REFERENCE SYMBOLS

1 External electrode main body
2 Plating layer of first metal (low melting point metal) constituting external electrode
3 External electrode (first joining object)
10 Ceramic laminate
11 Cu electrode film
12 Plating layer of first metal (low melting point metal) constituting electrode for mounting
13 Electrode for mounting (second joining object)
A Chip type electronic part
B Glass-epoxy substrate
C Insert material
D Joint structure
M12 Intermetallic compound

The invention claimed is:

1. A method of joining objects to each other, the method comprising:
   locating an insert material between a first joining object and a second joining object, the first joining object and/or the second joining object having a first metal composed of Sn or an alloy containing Sn,
   the insert material containing, as a main component, a second metal which is an alloy containing at least one selected from among Cu—Ni, Cu—Mn, Cu—Al and Cu—Cr alloys, which each contain 70% or more of Cu, the first metal having a lower melting point than the second metal; and
   subjecting the first joining object and the second joining object to a heat treatment while the insert material is located therebetween until an intermetallic compound of the first metal and the second metal is produced such that the first joining object and the second joining object are joined to each other.

2. The joining method according to claim 1, wherein the first metal is an alloy containing Sn in an amount of 70% by weight or more.

3. The joining method according to claim 1, wherein the first metal is an alloy containing Sn in an amount of 85% by weight or more.

4. The joining method according to claim 1, wherein the second metal is predominantly composed of a Cu—Ni alloy.

5. The joining method according to claim 4, wherein the Cu—Ni alloy contains Ni in an amount of 5 to 30% by weight.

6. The joining method according to claim 1, wherein the second metal is predominantly composed of a Cu—Mn alloy.

7. The joining method according to claim 6, wherein the Cu—Mn alloy contains Mn in an amount of 5 to 30% by weight.

8. The joining method according to claim 1, wherein the heat treatment is 250° C. for 30 minutes.

9. A method for producing a joint structure, wherein the joining method according to claim 1 is used.

* * * * *